United States Patent
Chen et al.

(10) Patent No.: US 9,543,420 B2
(45) Date of Patent: Jan. 10, 2017

(54) PROTECTION DEVICE AND RELATED FABRICATION METHODS

(71) Applicants: Wen-Yi Chen, Chandler, AZ (US); Chai Ean Gill, Chandler, AZ (US)

(72) Inventors: Wen-Yi Chen, Chandler, AZ (US); Chai Ean Gill, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 13/946,613

(22) Filed: Jul. 19, 2013

(65) Prior Publication Data

US 2015/0021739 A1  Jan. 22, 2015

(51) Int. Cl.
| | |
|---|---|
| *H01L 29/49* | (2006.01) |
| *H01L 29/73* | (2006.01) |
| *H01L 29/66* | (2006.01) |
| *H01L 29/735* | (2006.01) |
| *H01L 27/02* | (2006.01) |
| *H01L 29/10* | (2006.01) |
| H01L 29/08 | (2006.01) |

(52) U.S. Cl.
CPC ........... *H01L 29/73* (2013.01); *H01L 27/0259* (2013.01); *H01L 29/1008* (2013.01); *H01L 29/6625* (2013.01); *H01L 29/735* (2013.01); *H01L 29/0821* (2013.01)

(58) Field of Classification Search
CPC .. H01L 29/73; H01L 27/0259; H01L 29/1008; H01L 29/6625; H01L 29/735; H01L 29/0821
USPC .................. 257/477, 557, E27.023
See application file for complete search history.

(56) References Cited

U.S. PATENT DOCUMENTS

| | | | |
|---|---|---|---|
| 3,629,609 A | * | 12/1971 | Pedersen .............. H03K 19/088 326/129 |
| 5,605,850 A | | 2/1997 | Villa |
| 5,850,095 A | | 12/1998 | Chen et al. |

(Continued)

FOREIGN PATENT DOCUMENTS

| | | |
|---|---|---|
| JP | S61208871 A | 9/1986 |
| JP | 62291962 | 12/1987 |

(Continued)

OTHER PUBLICATIONS

Chen, J. et al., "Design and layout of a high ESD performance NPN structure for submicron BiCMOS/Bipolar circuits," in Proc. IEEE Reliab. Phys. Symp., pp. 227-232, 1996.

(Continued)

*Primary Examiner* — Michael Shingleton

(57) ABSTRACT

Protection device structures and related fabrication methods are provided. An exemplary semiconductor protection device includes a base region of semiconductor material having a first conductivity type, an emitter region within the base region having the opposite conductivity type, and a collector region of semiconductor material having the second conductivity type, wherein at least a portion of the base region resides between the emitter region and the collector region. A depth of the collector region is greater than a depth of the emitter region and less than or equal to a depth of the base region such that a distance between a lateral boundary of the emitter region and a proximal lateral boundary of the collector region is greater than zero and the collector region does not overlap or otherwise underlie the emitter region.

20 Claims, 9 Drawing Sheets

(56) References Cited

U.S. PATENT DOCUMENTS

| | | |
|---|---|---|
| 6,747,294 B1 | 6/2004 | Gupta et al. |
| 6,853,053 B1 | 2/2005 | Vashchenko et al. |
| 7,427,787 B2 | 9/2008 | Steinhoff |
| 7,723,823 B2 | 5/2010 | Gill et al. |
| 9,018,072 B2 | 4/2015 | Gendron et al. |
| 2005/0207077 A1 | 9/2005 | Xu et al. |
| 2006/0091497 A1 | 5/2006 | Sato |
| 2007/0181948 A1 | 8/2007 | Liaw et al. |
| 2007/0210419 A1 | 9/2007 | Nawate et al. |
| 2008/0044955 A1 | 2/2008 | Salcedo et al. |
| 2009/0032814 A1 | 2/2009 | Vashchenko et al. |
| 2009/0090972 A1 | 4/2009 | Vinson |
| 2009/0213506 A1 | 8/2009 | Zhan et al. |
| 2010/0230719 A1 | 9/2010 | Sawahata |
| 2010/0320501 A1 | 12/2010 | Gendron et al. |
| 2011/0101444 A1 | 5/2011 | Coyne et al. |
| 2011/0175198 A1 | 7/2011 | Zhan et al. |
| 2011/0176243 A1 | 7/2011 | Zhan et al. |
| 2011/0176244 A1 | 7/2011 | Gendron et al. |
| 2011/0204415 A1 | 8/2011 | Van Wijmeersch et al. |
| 2012/0098096 A1 | 4/2012 | Lin et al. |
| 2012/0119330 A1 | 5/2012 | Hwang |
| 2012/0168906 A1* | 7/2012 | Kuo et al. ............ 257/557 |
| 2012/0175673 A1 | 7/2012 | Lee |
| 2012/0286396 A1* | 11/2012 | Coyne ............ 257/539 |
| 2013/0119433 A1 | 5/2013 | Wang |

FOREIGN PATENT DOCUMENTS

| | | |
|---|---|---|
| JP | H031544 A | 1/1991 |
| JP | 09191079 H | 7/1997 |
| JP | 2006186225 A | 7/2006 |
| JP | 2007214526 A | 8/2007 |
| JP | 2007242923 A1 | 9/2007 |
| JP | 2003282715 A | 10/2013 |
| WO | 2009048911 | 4/2009 |

OTHER PUBLICATIONS

European Patent and Trade Mark Office, European Search Report for European Patent Application No. 14177138.6, mailed Mar. 31, 2015.

PCT/US2011/020358 International Search Report and Written Opinion mailed Aug. 30, 2011.

\* cited by examiner

PROTECTION DEVICE AND RELATED FABRICATION METHODS

TECHNICAL FIELD

Embodiments of the subject matter described herein relate generally to electronic devices, and more particularly, to electrostatic discharge protection devices and related fabrication methods.

BACKGROUND

Modern electronic devices, and particularly, integrated circuits, are at risk of damage due to electrostatic discharge (ESD) events. During an ESD event, a voltage (or current) may be provided to one or more terminals of an electronic device that causes the voltage between those terminals to exceed the designed maximum voltage of the device, which could impair subsequent operation of the device. For example, a voltage at a terminal of an electronic device during an ESD event may exceed the breakdown voltage of one or more components of the device, and thereby potentially damage those components. Accordingly, electronic devices include discharge protection circuitry that provides protection from excessive voltages across electrical components during ESD events.

To avoid interfering with normal operation of the device being protected, the discharge protection circuitry is typically designed to turn on and conduct current when the applied voltage exceeds the operating voltage of the device but before the applied voltage exceeds the breakdown voltage of the device. In practice, the discharge protection circuitry may continue to conduct current after being triggered by a transient voltage until the applied voltage is decreased below a particular voltage, referred to as a holding (or snapback) voltage. Accordingly, when the holding voltage is less than the design voltage, discharge protection circuitry may be susceptible to latchup and continue to conduct current at the design voltage, thereby impairing the functionality of the discharge protection circuitry after an ESD event. For example, a transient noise superimposed on a supply voltage may cause the discharge protection circuitry to turn on and continue conducting current after the transient noise is removed when the holding voltage is less than the supply voltage.

BRIEF DESCRIPTION OF THE DRAWINGS

The various embodiments will hereinafter be described in conjunction with the following drawing figures, which are not necessarily drawn to scale, wherein like numerals denote like elements, and wherein.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Additionally, there is no intention to be bound by any expressed or implied theory presented in the preceding technical field, background, or the following detailed description.

Embodiments of the subject matter described herein relate to electrostatic discharge (ESD) protection devices and related circuitry having an increased holding voltage for better noise immunity along with reduced area requirements. As described in greater detail below, the ESD clamping circuit includes a bipolar junction transistor (BJT) having a relatively deep collector that increases a depth of a breakdown region but does not extend laterally underneath the relatively shallow emitter of the BJT. In other words, the collector does not underlie the emitter, or alternatively, the emitter does not overlie the collector, such that at least a portion of the base resides vertically between the collector and the emitter. As a result, the effective width of the base and/or depletion layer is increased, which, in turn, reduces the likelihood of punch-through and increases the holding voltage of the BJT. Increasing the width of the base and/or depletion layer allows the lateral separation distance (or spacing) between the collector and the emitter to be reduced, which, in turn, reduces the lateral area requirements for the BJT. Thus, when multiple instances of the BJT are configured electrically parallel to one another in a multi-finger configuration to achieve improved current handling, the lateral die area required for a given number of BJTs is reduced. In other words, the ratio of the damage onset threshold current with respect to die area (e.g., the damage onset threshold current density) is improved. For example, in one embodiment, a damage onset threshold current density of $6.6 \times 10^{-4}$ Amperes per square micron was achieved compared to a damage onset threshold current density of $3.47 \times 10^{-4}$ Amperes per square micron for a comparable prior art ESD clamping circuit rated for the same voltage level.

Figure 1:
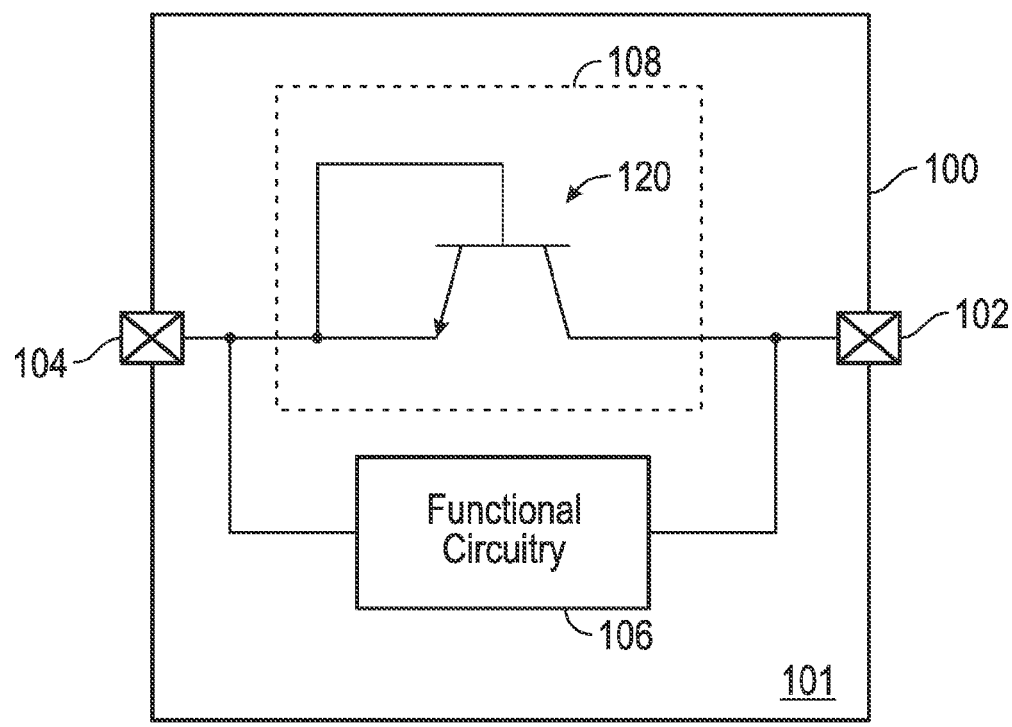
FIG. 1 is a schematic diagram of an exemplary electronic device in accordance with one embodiment of the invention.

Turning now to FIG. 1, an exemplary electronic device package 100 includes one or more package interfaces 102, 104, functional circuitry 106 coupled to the package interfaces 102, 104, and protection circuitry 108 coupled to the interfaces 102, 104. In exemplary embodiments, the functional circuitry 106 and the protection circuitry 108 are formed, fabricated, mounted, or otherwise provided on a substrate (or die) 101 and encapsulated in a common device package to achieve the packaged electronic device 100. In this regard, in some embodiments, the substrate 101 may be realized as a semiconductor substrate having both the functional circuitry 106 and the protection circuitry 108 fabricated thereon, while in other embodiments, the substrate 101 may be realized as a package substrate (e.g., a lead frame, circuit board, or the like) that the functional circuitry 106 and the protection circuitry 108 are soldered, affixed, or otherwise mounted to. It should be understood that FIG. 1 is a simplified representation of the electronic device 100 for purposes of explanation and ease of description, and FIG. 1 is not intended to limit the application or scope of the subject matter in any way. Thus, although FIG. 1 depicts direct electrical connections between components, alternative embodiments may employ intervening circuit elements and/or components while functioning in a substantially similar manner.

The package interfaces 102, 104 generally represent the physical input/output interfaces to/from the functional circuitry 106 encapsulated in the electronic device 100. Depending on the embodiment, each of the package interfaces 102, 104 may be realized as an individual pin, pad, lead, terminal, solder ball, or another suitable physical interface to the electronic device 100. In accordance with one or more embodiments, the design (or intended) voltage for the first package interface 102 is greater than the design voltage for the second package interface 104. For example, the first package interface 102 may be realized as a positive reference (or supply) voltage input to the electronic device 100 and the second package interface 104 is realized as a negative reference (or ground) voltage input to the electronic device 100. Accordingly, for purposes of explanation, but without limitation, the first package interface 102 may alternatively be referred to herein as the higher voltage terminal, the positive reference voltage terminal, the supply voltage terminal, or the like, while the second package interface 104 may alternatively be referred to herein as the lower voltage terminal, the negative reference voltage terminal, the ground voltage terminal, or the like.

The functional circuitry 106 generally represents the components of the electronic device 100 configured to provide the desired functionality for the electronic device 100. In this regard, depending on the embodiment, the functional circuitry 106 may be realized as any suitable combination of processing circuitry (e.g., one or more processing cores, processors, controllers, microcontrollers, microprocessors, or the like), logic circuitry, memories or other data storage elements, discrete components, analog and/or digital components, or other hardware components and/or circuitry configured to provide the desired functionality for the electronic device 100. In an exemplary embodiment, the functional circuitry 106 is coupled to the package interfaces 102, 104 to receive a supply voltage, design voltage, or another operating voltage that facilitates the desired operation of the functional circuitry 106.

Still referring to FIG. 1, the protection circuitry 108 is connected electrically between the higher voltage terminal 102 and the lower voltage terminal 104 and configured electrically parallel to the functional circuitry 106 to protect the functional circuitry 106 from a transient voltage difference between the device terminals 102, 104 that exceeds a breakdown voltage ($V_B$) of the functional circuitry 106. In the illustrated embodiment, the protection circuitry 108 is unidirectional and functions as an ESD voltage clamp that begins conducting current when the transient voltage at the higher voltage terminal 102 relative to the voltage at the lower voltage terminal 104 exceeds a transient triggering voltage ($V_{T1}$) of the protection circuitry 108. In this regard, both the steady state (or DC) breakdown voltage ($V_{TDC}$) and transient triggering voltage ($V_{T1}$) of the protection circuitry 108 are chosen to be greater than the supply (or operating) voltage ($V_O$) of the functional circuitry 106 but less than the breakdown voltage ($V_B$) of the functional circuitry 106. In this manner, the protection circuitry 108 conducts current when the voltage difference between the terminals 102, 104 exceeds a ESD triggering voltage (i.e., the DC breakdown voltage ($V_{TDC}$) or the transient triggering voltage ($V_{T1}$)) and thereby clamps the voltage difference that the functional circuitry 106 is exposed to. Thus, the likelihood of the functional circuitry 106 being exposed to a voltage difference that exceeds the breakdown voltage ($V_B$) of the functional circuitry 106 during an ESD event is reduced.

Figure 2:
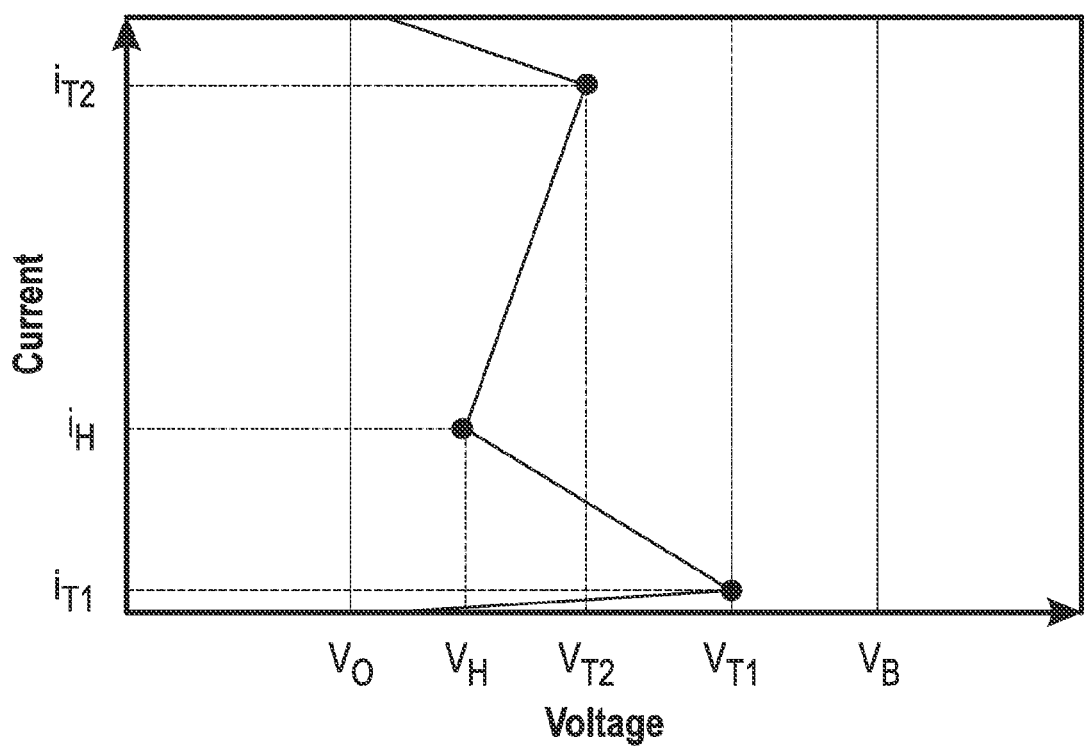
FIG. 2 is a graph depicting the relationship between transmission line pulse current and voltage for the protection circuitry in the electronic device of FIG. 1 in accordance with one embodiment.

FIG. 2 illustrates a graph of a transmission line pulse current versus voltage for a typical ESD protection circuit, such as, for example, the protection circuitry 108 of FIG. 1. Referring to FIGS. 1-2, as voltage applied to the higher voltage terminal 102 is increased relative to the voltage at the lower voltage terminal 104, very little current flows through the protection circuitry 108 until the transient triggering voltage ($V_{T1}$) of the protection circuitry 108 is reached, at which point avalanche breakdown in the BJT 120 occurs and the protection circuitry 108 begins conducting an ESD discharge current. The current through the protection circuitry 108 increases from a triggering current ($i_{T1}$) at the transient triggering point to a holding current ($i_H$) at a holding (or snapback) voltage ($V_H$), at which point the protection circuitry 108 will stop conducting current if the applied at the higher voltage terminal 102 relative to the voltage at the lower voltage terminal 104 falls below the holding voltage. Alternatively, if the applied ESD voltage (or current) increases, the discharge current through the protection circuitry 108 increases until reaching a thermal breakdown current ($i_{T2}$) at voltage ($V_{T2}$), at which point functionality of the protection circuitry 108 may be irreversibly impaired. This current ($i_{T2}$) may alternatively be referred to as the damage onset threshold current or secondary breakdown current.

Referring again to FIG. 1, in exemplary embodiments, the protection circuitry 108 includes a bipolar junction transistor (BJT) element 120 configured to provide an ESD voltage clamp. The illustrated BJT element 120 is realized as an NPN bipolar transistor element having a collector electrode coupled to the higher voltage terminal 102, an emitter electrode coupled to the lower voltage terminal 104, and a base electrode electrically connected directly to the emitter electrode (e.g., short-circuited or via a negligible series impedance) and coupled to the lower voltage terminal 104. In this configuration, the BJT element 120 functions as silicon-controlled rectifier (SCR), with the collector electrode functioning as an anode of the SCR, the emitter electrode functioning as a cathode of the SCR, and the base electrode functioning as a gate of the SCR. It should be noted that while the subject matter may be described herein in the context of NPN bipolar junction transistor elements, the subject matter is not intended to be limited to NPN bipolar junction transistor elements and may be implemented in an equivalent manner for PNP bipolar junction transistor elements. That said, the benefits of NPN bipolar junction transistor elements often make NPN bipolar junction transistor elements preferable for many applications. Accordingly, for purposes of explanation but without limitation, the subject matter is described herein in the context of NPN devices. As described above, protection circuitry 108 is unidirectional and capable of conducting current from the higher voltage terminal 102 to the lower voltage terminal 104 to clamp voltages between terminals 102, 104 from ESD events when the voltage at the higher voltage terminal 102 exceeds the voltage at the lower voltage terminal 104 by more than a transient triggering voltage and/or a DC breakdown voltage for the protection circuitry 108.

Figure 3:
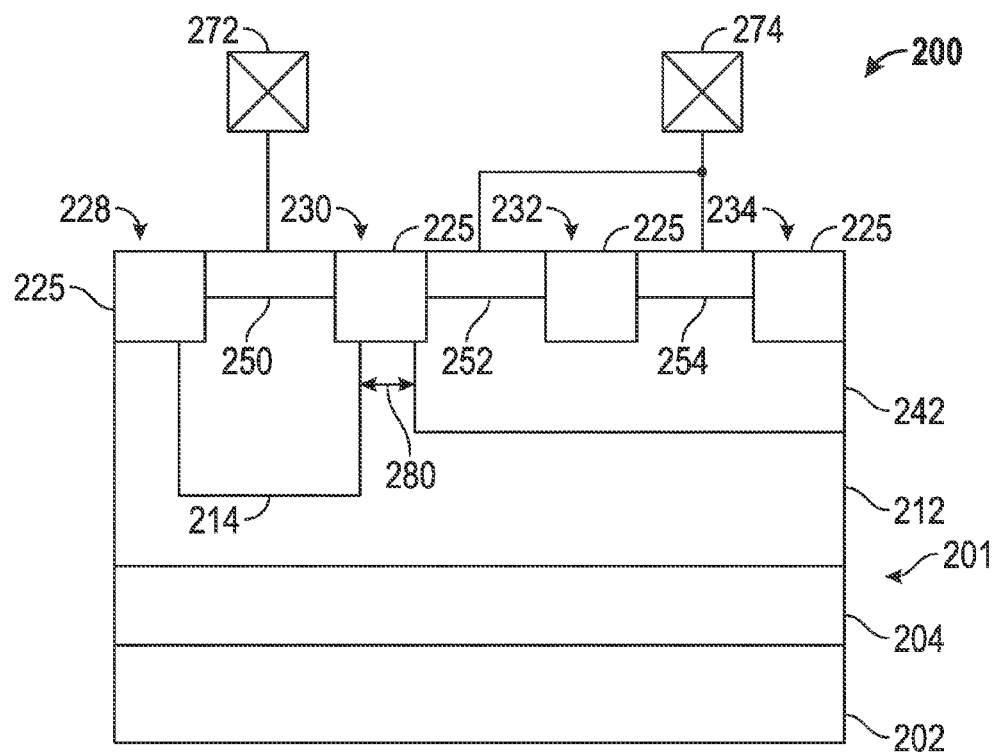
FIG. 3 depicts a cross-sectional view of one exemplary semiconductor device structure suitable for use in the electronic device of FIG. 1 in accordance with one or more embodiments of the invention.

FIG. 3 illustrates, in cross-section, a semiconductor device structure 200 suitable for use as the protection circuitry 108 and/or BJT element 120 in the electronic device 100 of FIG. 1 in accordance with one or more exemplary embodiments. The protection device structure 200 includes a BJT element (e.g., BJT element 120) having a collector region (comprised of regions 214, 250) and an emitter region (comprised of region 252) having the same conductivity and a base region (comprised of regions 212, 242, 254) of the opposite conductivity formed in a substrate 201 of semiconductor material. As described above in the context of FIG. 1, in exemplary embodiments, the collector regions 214, 250 are coupled to a first package interface 272 corresponding to a higher voltage terminal 102 of the electronic device 100 while the emitter region 252 and the base regions 212, 242, 254 are electrically connected to one another and coupled to a second package interface 274 corresponding to a lower voltage terminal 104 of the electronic device 100.

The emitter region 252 is relatively shallow and is formed in or otherwise resides within a base well region 242 having an opposite conductivity type as the emitter region 252. The base well region 242 has a dopant concentration that is greater than a dopant concentration of a surrounding base well region 212, and accordingly, the base well region 242 may be alternatively referred to herein as being higher (or heavier) doped and the base well region 212 may be referred to herein as lower (or lighter) doped. As described below in the context of FIG. 8, the lighter doped base well region 212 may be comprised of one or more different regions having a dopant concentration less than the dopant concentration of the higher doped base well region 242. A collector well region 214 having the same conductivity type as the emitter region 252 and an opposite conductivity type as the base regions 212, 242, 254 extends from the upper surface of the substrate 201 to a depth that is greater than a depth of the emitter region 252. In this regard, the collector well region 214 pulls the breakdown region within the portion of the base well regions 212, 242 residing between the collector well region 214 and the emitter region 252 deeper and away from the upper surface of the protection device structure 200.

In accordance with one or more embodiments, the collector well region 214 also extends to a depth relative to the surface of the substrate 201 that is greater than a depth of the higher doped base well region 242. In the illustrated embodiment of FIG. 3, the depth of the collector well region 214 relative to the upper surface of the substrate 201 is less than or equal to the depth of the lighter base region 212. In this regard, a portion of the lighter doped base region 212 underlies the collector regions 214, 250 (or alternatively, the collector regions 214, 250 overlie a portion of the lighter doped base region 212). In other words, the collector well region 214 does not underlie the lighter doped base region 212. In accordance with one or more embodiments, the depth of the emitter region 252 is in the range of about 0.3 microns to about 0.6 microns, the depth of the higher doped base well region 242 is in the range of about 1.5 microns to about 2 microns, and the depth of the collector well region 214 is about 4 microns. In the illustrated embodiment, the substrate 201 is realized as a silicon-on-insulator (SOI) substrate that includes a buried layer of dielectric material 204 overlying a handle layer of semiconductor material 202, wherein the portion of the lighter doped base region 212 underlying the collector regions 214, 250 resides between the dielectric material 204 and the collector well region 214. It should be noted that the subject matter described herein is not limited to SOI substrates, and the protection device structure 200 may also be fabricated on a bulk semiconductor substrate.

In exemplary embodiments, isolation regions 228, 230, 232, 234 of dielectric material 225 are formed in the upper surface of the substrate 201 such that an isolation region 230 resides laterally between the emitter region 252 and the collector contact region 250 and another isolation region 232 resides laterally between the emitter region 252 and the base contact region 254. In exemplary embodiments, the isolation regions 228, 230, 232, 234 are realized as shallow isolation regions having a depth that is greater than the depths of the contact regions 250, 252, 254 but less than the depths of the collector well region 214 and the higher doped base well region 242. As described in greater detail below, the isolation region 230 encourages distribution of the collector voltage (e.g., at terminal 272) vertically through a greater percentage (or area) of the base well regions 212, 242 while the isolation region 232 encourages distribution of the collector voltage laterally across a greater percentage (or area) of the base well regions 212, 242 underlying the base contact region 254 and/or otherwise distal to the collector well region 214.

In the illustrated embodiment of FIG. 3, the proximal lateral boundaries of the collector well region 214 and the higher doped base well region 242 extend underneath the shallow isolation region 230 to define a breakdown region within the portion of the lighter doped base region 212 that underlies the shallow isolation region 230 and resides between the collector well region 214 and the higher doped base well region 242. In exemplary embodiments, the collector well region 214 and the higher doped base well region 242 are spaced apart by a lateral separation distance 280 corresponding to the width of the portion of the lighter doped base region 212 underlying the shallow isolation region 230 between well regions 214, 242. In this regard, the separation distance 280 dictates the DC breakdown and transient triggering voltages of the protection device structure 200. In accordance with one or more embodiments, the separation distance 280 is about one micrometer (or micron) or less. In some embodiments, the separation distance 244 may be equal to zero, such that the collector well region 214 abuts the base well region 242.

Still referring to FIG. 3, as described above, the isolation region 232 between the emitter region 252 and the base contact region 254 extends to a depth that is greater than the depth of the regions 252, 254 to encourage vertical and lateral distribution of the voltage (or electrical potential) of the collector well region 214 across a greater percentage (or area) of the higher doped base well region 242 and away from the emitter region 252 when the emitter region 252 and the base contact region 254 are electrically connected (or short-circuited) at the same electrical potential, thereby increasing the effective width of the depletion region within the higher doped base well region 242. Additionally, by virtue of the depth of the collector well region 214 being less than the depth of the lighter doped base region 212, at least a portion of the voltage (or electrical potential) of the collector well region 214 may be distributed or otherwise supported by the underlying portion of the lighter doped base region 212. In this manner, the holding voltage of the protection device structure 200 is increased, which, in turn, reduces the sensitivity of the protection device structure 200 to transient noise signals at terminal 272. Additionally, the susceptibility of the protection device structure 200 to punch-through as the collector-to-emitter spacing is reduced by virtue of the increased effective width of the depletion region within the higher doped base well region 242. In this regard, the collector-to-emitter spacing may be less than three microns, and in some embodiments, as small as 0.6 microns, thereby allowing the protection device structure 200 to be fabricated in a smaller die area.

Figure 4:
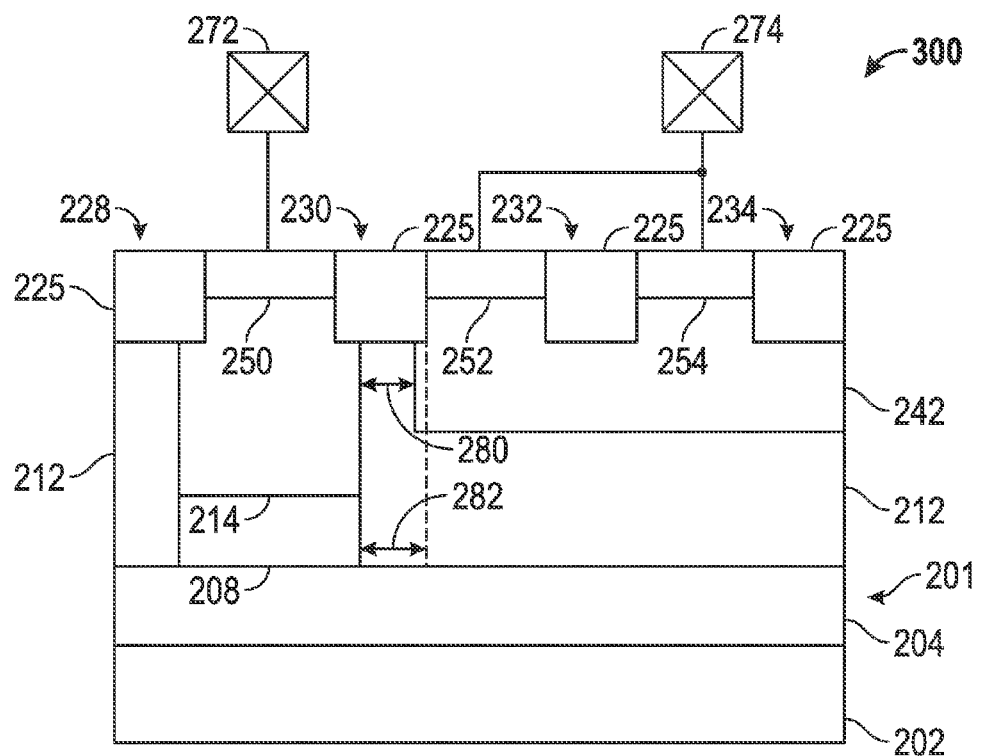
FIG. 4 depicts a cross-sectional view of another exemplary semiconductor device structure suitable for use in the electronic device of FIG. 1 in accordance with one or more alternative embodiments of the invention.

FIG. 4 illustrates, in cross-section, another embodiment of a semiconductor device structure 300 suitable for use as the protection circuitry 108 and/or BJT element 120 in the electronic device 100 of FIG. 1 in accordance with one or more exemplary embodiments. The collector in the protection device structure 300 includes a buried region 208 that underlies and abuts the collector well region 214 and has the same conductivity type as the collector well region 214 and the collector contact region 250. In accordance with one or more embodiments, when the substrate 201 is realized as an SOI substrate, the buried region 208 abuts or otherwise contacts the underlying buried layer of dielectric material 204 of the substrate 201 such that the depth of the collector (regions 208, 214, 250) is equal to the depth of the base (regions 212, 242, 254). In accordance with one or more embodiments, the dopant concentration of the buried region 208 is greater than or equal to the dopant concentration of the collector well region 214. For example, in some embodiments, the buried region 208 may be realized as a portion of an N-type buried layer (NBL) provided in other regions of the substrate 201. In one or more alternative embodiments, the dopant concentration of the buried region 208 is less than the dopant concentration of the collector well region 214. For example, the buried region 208 may be realized as a portion of a lightly doped N-type buried layer (LNBL) provided in other regions of the substrate 201.

In exemplary embodiments, the width of the buried region 208 is chosen such that the lighter doped base region 212 is maintained intact underneath the emitter region 252 and the buried region 208 does not extend or otherwise reside underneath the emitter region 252. In other words, a lateral separation distance 282 between a lateral boundary of the emitter region 252 and a proximal lateral boundary of the buried collector well region 208 is greater than zero such that the buried region 208 does not overlap the emitter region 252. That is, the buried region 208 does not underlie the portion of the lighter doped base region 212 that underlies the emitter region 252. In accordance with one or more embodiments, the lateral boundaries of the buried region 208 are substantially vertically aligned with the lateral boundaries of the collector well region 214, such that the buried region 208 does not extend or otherwise reside underneath the emitter region 252 or the higher doped base well region 242. In this regard, the center of the buried region 208 may be substantially vertically aligned with the center of the collector well region 214 and/or the collector contact region 250. In other embodiments, the width of the buried region 208 may be greater or less than the width of the collector well region 214. For example, in some embodiments, the width of the buried region 208 may be less than the collector well region 214. Alternatively, the width of the buried region 208 may be greater than the collector well region 214 without extending underneath the emitter region 252.

In a similar manner as described above in the context of FIG. 3, the collector regions 208, 214, 250 are coupled to the higher voltage terminal 272 while the emitter region 252 and the base regions 212, 242, 254 are coupled to the lower voltage terminal 274, with the relatively shallow emitter region 252 residing within the higher doped base well region 242 and being electrically connected to the base contact region 254. By virtue of the buried region 208, the area of the collector is increased, thereby improving the current handling capability of the collector and increasing the damage onset threshold current relative to the protection device structure 200 of FIG. 3. At the same time, the buried region 208 also causes the breakdown region to occur deeper within the base well regions 212, 242 and thereby increases the effective width of the base and/or depletion layer, though not to the extent of the protection device structure 200 of FIG. 3. In this regard, the protection device structure 200 of FIG. 3 may achieve a higher holding voltage than the protection device structure 300 of FIG. 4 while the protection device structure 300 of FIG. 4 may achieve a higher damage onset threshold current than the protection device structure 200 of FIG. 3. For example, using a separation distance 280 of one micron, an embodiment of the protection device structure 200 of FIG. 3 achieved a holding voltage of 23.5 Volts and a damage onset threshold current of 1.55 Amperes and an embodiment the protection device structure 300 of FIG. 4 achieved a holding voltage of 21 V and a damage onset threshold current of 2.1 A. In comparison, a comparable protection device structure having a full N-type buried layer (NBL) underneath the collector that extends underneath and overlaps the emitter and base contact regions achieved a holding voltage of 15 V. Additionally, the collector-to-emitter spacing for the protection device structure 200 of FIG. 3 and/or the protection device structure 300 of FIG. 4 may be reduced because the collector well does not extend laterally underneath the emitter in a manner that would otherwise reduce the effective width of the base and/or depletion layer between the collector and the emitter when the base and the emitter are electrically connected to one another. In either of the embodiment of FIG. 3 or the embodiment of FIG. 4, the depth of the collector is greater than the depth of the emitter but less than or equal to a depth of the base well that encompasses or otherwise surrounds the emitter.

FIGS. 5-13 illustrate, in cross-section, a semiconductor device structure 400 suitable for use as the protection circuitry 108 in the electronic device 100 of FIG. 1 in accordance with one or more exemplary embodiments. Various steps in the manufacture of semiconductor devices are well known and so, in the interest of brevity, many conventional steps will only be mentioned briefly herein or will be omitted entirely without providing the well-known process details. Furthermore, it should be appreciated that although the subject matter may be described herein in the context of NPN BJT elements, the subject matter is not intended to be limited to NPN BJT elements and may be implemented in an equivalent manner for PNP BJT elements (e.g., by interchanging the conductivities of the doped regions).

Figure 5:
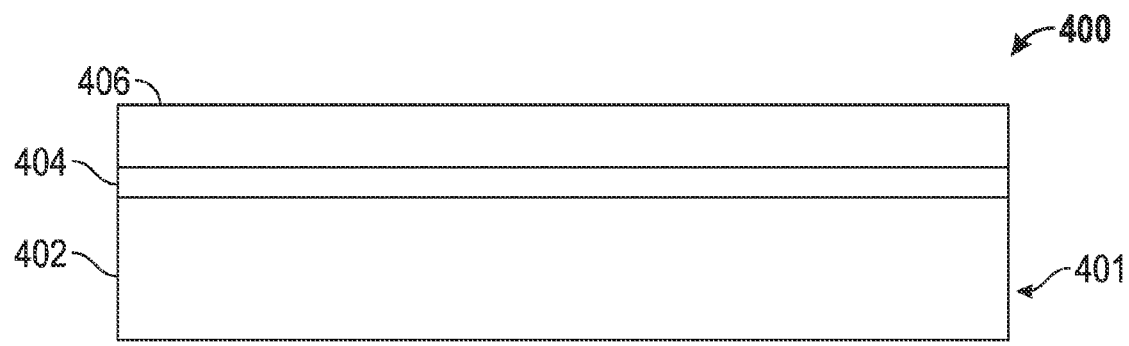
FIGS. 5-13 illustrate, in cross section, exemplary methods for fabricating a semiconductor device structure suitable for use in the electronic device of FIG. 1 in accordance with one embodiment of the invention.

Referring now to FIG. 5, in exemplary embodiments, the protection device structure 400 is fabricated on a semiconductor substrate, such as a SOI substrate 401 having a support (or handle) layer 402 of semiconductor material, an insulating layer 404 of dielectric material on or otherwise overlying the support layer 402, and a layer 406 of semiconductor material on or otherwise overlying the insulating layer 404. As described in greater detail below, in exemplary embodiments, the layer 406 of semiconductor material is utilized to epitaxially grow additional semiconductor material thereon, and accordingly, for convenience, but without limitation, the layer 406 of semiconductor material may alternatively be referred to herein as the seed layer. In an exemplary embodiment, the semiconductor material of each of the layers 402, 406 is realized as a silicon material, wherein the term "silicon material" is used herein to encompass the relatively pure silicon materials typically used in the semiconductor industry as well as silicon admixed with other elements such as germanium, carbon, and the like. Alternatively, one or more of the layers 402, 406 may be realized as germanium, gallium arsenide, and the like, and/or one or more of the layers 402, 406 may include layers of different semiconductor materials. In accordance with one embodiment, the insulating layer 404 is realized as an oxide layer formed in a subsurface region of the semiconductor substrate 401, also known as a buried oxide (BOX) layer. For example, the buried oxide layer 404 may be formed by oxidizing a wafer of semiconductor material (e.g., layer 406) which is then bonded to the support layer 402 to provide a buried layer 404 of oxide material between the support layer 402 and the seed layer 406.

In exemplary embodiments, the seed layer 406 is lightly doped. For example, the seed layer 406 may be realized as a P-type silicon material having a P-type dopant concentration in the of about $1\times10^{15}/cm^3$ to about $8\times10^{15}/cm^3$. The support layer 402 may also be doped with the same (or different) conductivity-determining impurity type as the seed layer 406. In exemplary embodiments, the support layer 402 is realized as an N-type silicon material. It should be understood that the protection devices and the fabrication processes described herein are not constrained by the substrate of semiconductor material utilized, and the fabrication process described herein may be used to create protection devices on a bulk semiconductor substrate.

Figure 6:
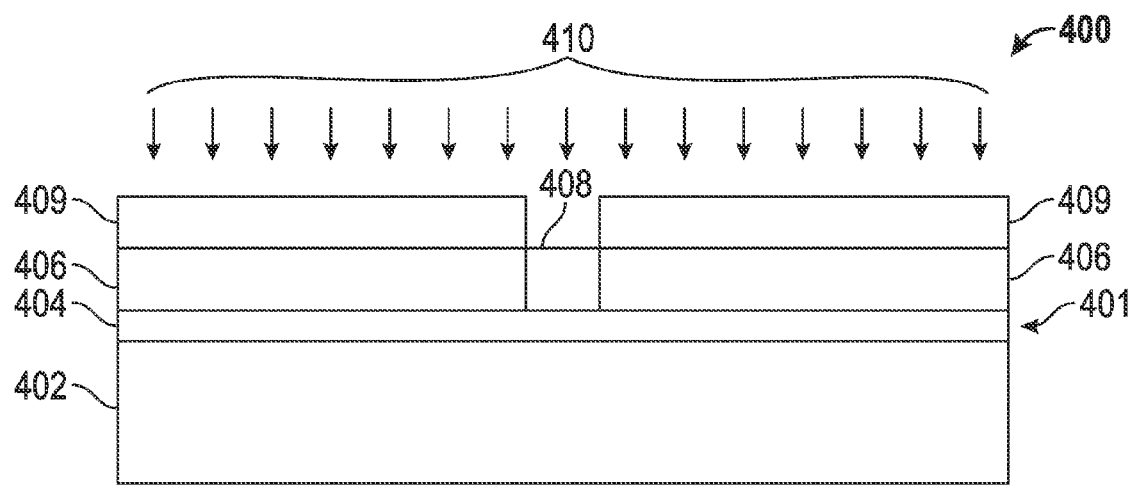

Referring now to FIG. 6, in accordance with one or more embodiments, the protection device structure 400 includes a buried collector well region that is more heavily doped than the subsequently formed overlying collector well region. In such embodiments, fabrication of the protection device structure 400 continues by masking peripheral portions of the protection device structure 400 and forming a doped region 408 of semiconductor material within the seed layer 406 having a conductivity type that is opposite the conductivity of the seed layer 406. In this regard, the protection device structure 400 is masked with a masking material 409, such as a photoresist material, that is patterned to provide an implantation mask that exposes the interior portion of the seed layer 406 to be used for the doped region 408. The doped region 408 is then formed by implanting N-type ions, such as antimony ions or phosphorous ions, illustrated by arrows 410, in the seed layer 406 with a dopant concentration in the range of about $1\times10^{18}/cm^3$ to about $1\times10^{19}/cm^3$ at an energy level in the range of about 50 kiloelectron volts (keV) to about 2000 keV. In the illustrated embodiment, the depth of the doped region 408 (after subsequent thermal annealing or any other diffusion) corresponds to the thickness of the seed layer 406 so that the doped region 408 extends to and abuts or otherwise contacts the insulating layer 404. For example, in accordance with one or more embodiments, the thickness of the seed layer 406 is about 2.7 microns, and the doped region 408 has a depth of about 2.7 microns that corresponds to the thickness of the seed layer 406. The doped region 408 functions as a buried collector well region that is relatively higher doped than a collector well region subsequently formed overlying the doped region 408, as described below in the context of FIG. 8. That said, in alternative embodiments, to achieve higher holding voltage, the protection device structure 400 may not include the doped region 408 as described above in the context of FIG. 3. In such embodiments, the doped region 408 is omitted or otherwise removed from the protection device structure 400. For example, the entirety of the region of the substrate 401 allocated to the protection device structure 400 may be masked with the masking material 409 while implanting ions 410 to provide an N-type buried layer (NBL) in other regions of the substrate 401.

In accordance with one or more alternative embodiments, the buried collector well region is more lightly doped than the subsequently formed overlying collector well region. For example, a relatively lighter doped region 408 may be formed by implanting N-type ions, illustrated by arrows 410, in the seed layer 406 with a dopant concentration in the range of about $1\times10^{16}/cm^3$, to about $5\times10^{17}/cm^3$ an energy level that provides a depth of the lighter doped region 408 (after subsequent thermal annealing or any other diffusion) that corresponds to the thickness of the seed layer 406. In this regard, the lighter doped region 408 may be realized as a portion of a lightly doped N-type buried layer (LNBL) provided in other regions of the substrate 401. In such embodiments, the doped region 408 functions as a buried collector well region that is relatively lighter doped than a collector well region subsequently formed overlying the doped region 408.

Figure 7:
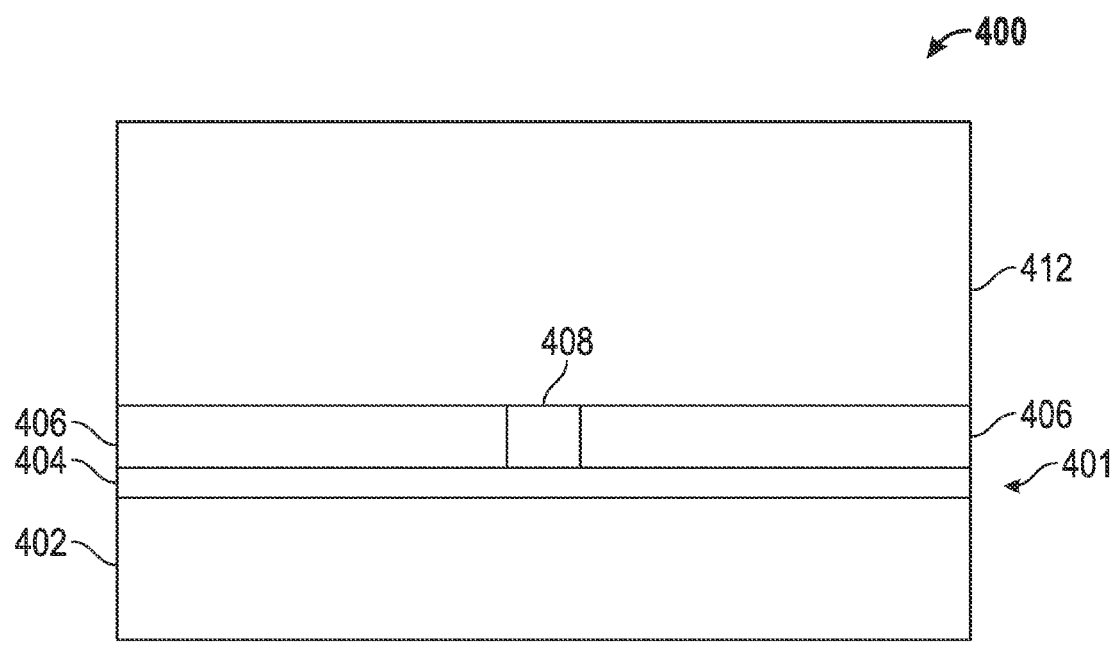

Referring now to FIG. 7, in the illustrated embodiment, fabrication of the protection device structure 400 continues by removing the masking material 409 and forming or otherwise providing a doped region of semiconductor material overlying the doped region 408 having a conductivity type opposite that of the doped region 408. For example, a P-type epitaxial layer 412 may be formed by epitaxially growing silicon material on the seed layer 406 and in-situ doping the silicon material by adding boron ions (or other P-type ions) to the reactants used to epitaxially grow the layer 412. In one or more embodiments, the epitaxial layer 412 has a P-type dopant concentration in the range of about $1\times10^{15}/cm^3$ to about $8\times10^{15}/cm^3$. In an exemplary embodiment, the epitaxial layer 412 is grown to a thickness in the range of about 2 microns to about 6 microns, which may vary depending on the needs of a particular application. It should be understood that the protection devices and the fabrication processes described herein are not constrained by the manner in which the doped region 408 and/or P-type layer 412 are formed, and the protection device structure 400 illustrated in FIG. 7 may be fabricated or otherwise achieved in a variety of alternative manners (e.g., the P-type layer 412 does not necessarily need to be realized as an epitaxial layer and does not necessarily need to be epitaxially grown and/or in-situ doped, the doped region 408 does not necessarily need to be formed by ion implantation, etc.).

Figure 8:
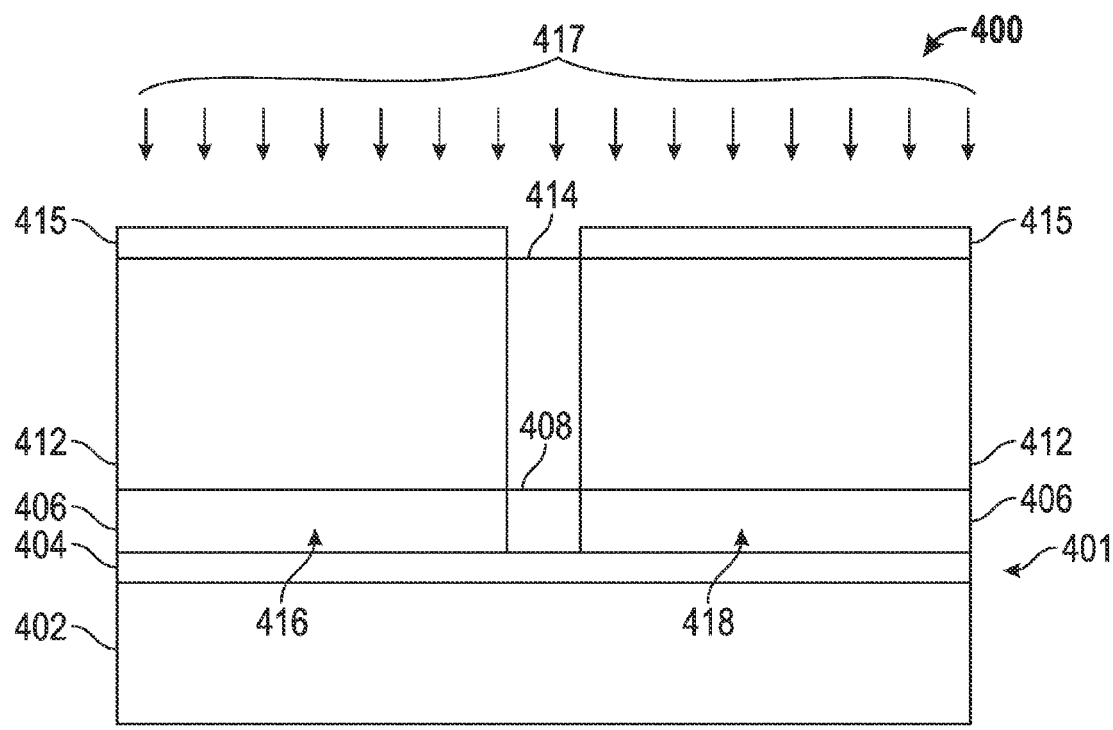

Turning now to FIG. 8, after forming the epitaxial layer 412, the fabrication process continues by masking portions of the epitaxial layer 412 and forming a doped sinker region 414 of semiconductor material having the opposite conductivity type within the epitaxial layer 412. The doped sinker region 414 is formed by masking the protection device structure 400 with a masking material 415 that is patterned to provide an implantation mask that exposes an interior (or central) portion of the epitaxial layer 412 that overlaps the doped region 408 to be used for the collector well region. An N-type sinker region 414 is formed by implanting N-type ions, such as phosphorous ions or arsenic ions, illustrated by arrows 417, in the epitaxial layer 412 with a dopant concentration in the range of about $1\times10^{16}/cm^3$ to about $1\times10^{19}/cm^3$, and more preferably within the range of about $5\times10^{17}/cm^3$ to about $4\times10^{18}/cm^3$, at an energy level in the range of about 2000 keV to about 3000 keV to provide the N-type sinker region 414 with a depth (after subsequent thermal annealing or any other diffusion) corresponding to the thickness of the epitaxial layer 412 so that the N-type sinker region 414 extends to and abuts the N-type buried region 408, thereby electrically connecting the N-type sinker region 414 to the N-type buried region 408. In the illustrated embodiment, the implantation mask 415 is patterned such that the lateral boundaries of the N-type sinker region 414 are substantially vertically aligned with the lateral boundaries of the N-type buried region 408 and the centers of the N-type sinker region 414 and the N-type buried region 408 are substantially concentric or otherwise coaxially aligned vertically. Although not illustrated, in alternative embodiments, the width of the N-type sinker region 414 may be greater than and/or less than the N-type buried region 408, as described above in the context of FIG. 4.

In the illustrated embodiment of FIG. 8, the N-type sinker region 414 and the N-type buried region 408 partition the P-type epitaxial layer 412 and the P-type seed layer 406 into separate P-type regions 416, 418 having a respective BJT element fabricated therein. For example, an instance of BJT element 120 may be fabricated in a first P-type region 416 comprised of lighter doped P-type layers 406, 412 and another instance of the BJT element 120 may be fabricated in the second P-type region 418 comprised of lighter doped P-type layers 406, 412. The multiple instances of BJT element 120 are configured electrically parallel to one another and may be part of a multi-finger configuration, as described below in the context of FIGS. 13-16. In this regard, the N-type regions 408, 414 function as part of the collector of each instance of BJT element 120, and accordingly, the regions 408, 414 may alternatively be referred to as shared or common collector regions. The P-type regions 416, 418 function as a relatively lightly doped portion of the base of the respective instance of BJT element 120, and accordingly, the P-type regions 416, 418 may alternatively be referred to as lighter doped base regions or lighter doped base well regions.

Figure 9:
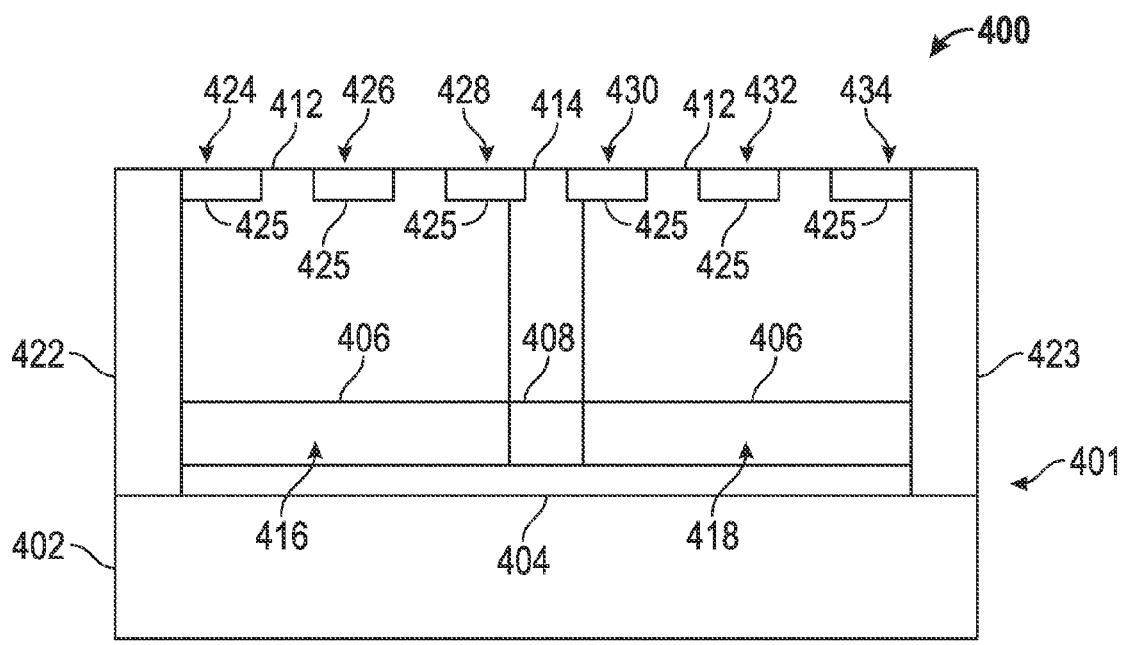

In the illustrated embodiment, after forming the N-type sinker region 414 the fabrication process continues by forming isolation regions, resulting in the protection device structure 400 illustrated in FIG. 9. The fabrication process may isolate the protection circuitry from adjacent semiconductor devices by performing deep trench isolation (DTI) to provide deep isolation regions 422, 423 of dielectric material. For example, to form deep isolation regions 422, 423, the interior portion of the protection device structure 400 is masked with a masking material that is subsequently patterned to expose the peripheral portions of the epitaxial layer 412 and seed layer 406, which are then etched until the buried layer 404 is exposed, and thereafter, a dielectric material, such as an oxide material, may be deposited in the trenches or grown on exposed surfaces of the trenches to fill the trenches, resulting in deep isolation regions 422, 423.

Additionally, shallow isolation regions 424, 426, 428, 430, 432, 434 of a dielectric material 425 are formed in the upper portions of the protection device structure 400 by performing shallow trench isolation (STI). To form the shallow isolation regions 424, 426, 428, 430, 432, 434, portions of the epitaxial layer 412 are masked with a masking material that is patterned to expose peripheral portions of the respective P-type regions 416, 418 adjacent to the deep isolation regions 422, 423, an interior (or central) portions of a respective P-type region 416, 418, a portion of a respective P-type region 416, 418 adjacent to the N-type sinker region 414, while leaving the central portion of the N-type sinker region 414 and remaining portions of the P-type regions 416, 418 masked. In exemplary embodiments, portions of the N-type sinker region 414 adjacent to the P-type regions 416, 418 are unmasked so that shallow isolation regions 428, 430 extend laterally beyond the boundaries of the P-type regions 416, 418 and overlap or otherwise extend into the N-type sinker region 414. The exposed portions of the N-type sinker region 414 and P-type regions 416, 418 are then etched to a desired depth (which is less than the thickness of the epitaxial layer 412), and a dielectric material 425, such as an oxide material, may be deposited to fill the trenches and then planarized to align with the surface of the protection device structure 400, resulting in shallow isolation regions 424, 426, 428, 430, 432, 434. In accordance with one or more exemplary embodiments, the depth of the shallow isolation regions 424, 426, 428, 430, 432, 434 is in the range of about 0.05 microns to about 1 micron, and more preferably, within the range of about 0.5 microns to about 0.6 microns.

Figure 10:
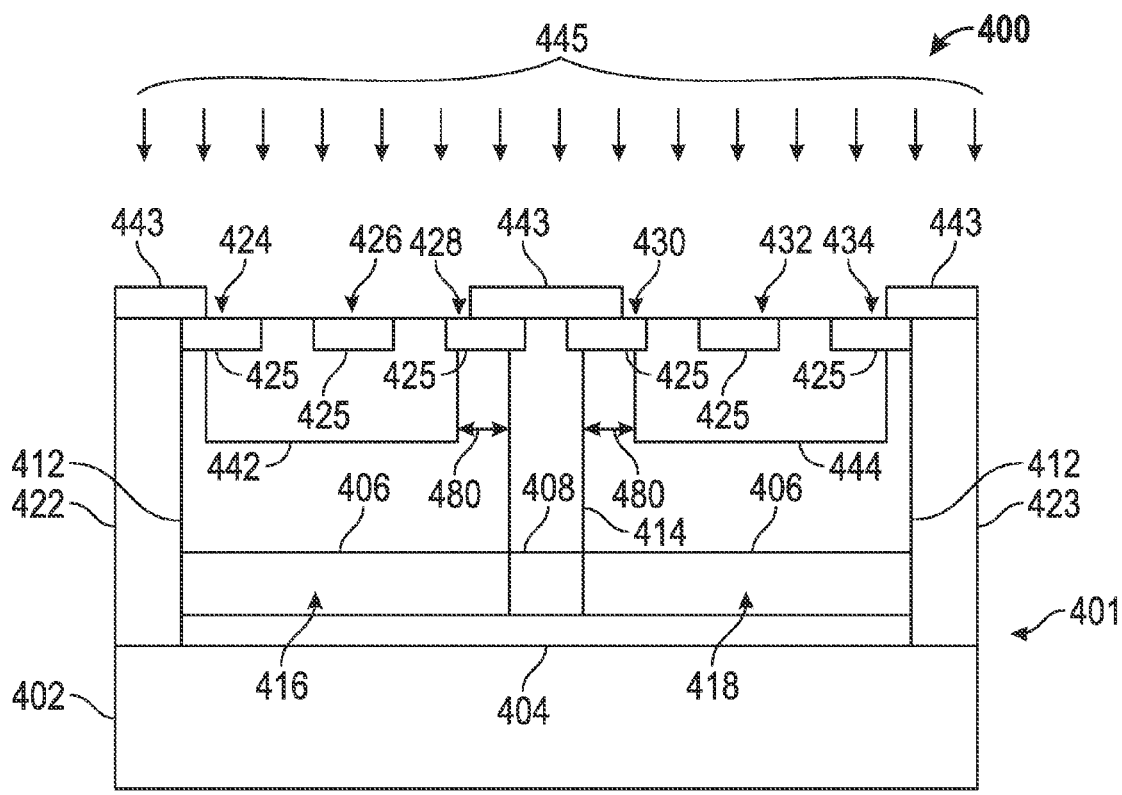

Turning now to FIG. 10, after forming the isolation regions, fabrication of the protection device structure 400 continues by masking continues by masking the N-type sinker region 414 and forming P-type well regions 442, 444 in the interior portions of the P-type well regions 416, 418. The dopant concentration of the P-type well regions 442, 444 is greater than or equal to the dopant concentration of the P-type epitaxial layer 412, and accordingly, the P-type well regions 442, 444 may alternatively be referred to herein as the higher or heavier doped base well regions. In accordance with one or more embodiments, a ratio of the dopant concentration of the higher doped base well regions 442, 444 to the dopant concentration of the lighter doped epitaxial layer 412 is greater than or equal to 10. In other words, the dopant concentration of the higher doped base well regions 442, 444 may be at least 10 times greater than the dopant concentration of the lighter doped base well regions 416, 418.

As described above, the P-well regions 442, 444 function as a relatively higher doped portion of the base electrode of a respective BJT element (e.g., an instance of BJT element 120) that surrounds or otherwise encompasses the emitter electrode of that respective BJT element. In the illustrated embodiment, the P-well regions 442, 444 are formed within the respective transistor regions 416, 418 and spaced apart from the N-type sinker region 414 by a lateral separation distance 480, wherein at least a portion of a respective lighter doped P-type well region 416, 418 remains intact laterally between the lateral boundary of a respective higher doped P-well region 442, 444 formed therein and the proximal lateral boundary of the N-type sinker region 414. In one or more exemplary embodiments, the lateral separation distance 480 between a lateral boundary of a respective P-well region 442, 444 and the proximal lateral boundary of the collector well region 438 is less than three microns while providing a protection device structure 400 with a holding voltage greater than 20 Volts. In some embodiments, a respective P-well region 442, 444 may abut or otherwise contact the N-type sinker region 414. The portion of a respective relatively lighter doped P-type base well region 416, 418 that remains intact underlying a respective isolation region 428, 430 and resides between a lateral boundary of the N-type region 414 and an adjacent lateral boundary of a respective higher doped P-type base well region 442, 444 dictates the avalanche breakdown voltage across the collector-base junction (e.g., between collector well region 414 and a respective higher doped base well region 442, 444) before the resulting electrical potential of the base forwardbiases the base-emitter junction and turns on or triggers a respective bipolar transistor element. In other words, the distance 480 between a lateral boundary of the N-type well region 414 and the proximal lateral boundary of P-well region 442 dictates the collector-to-base avalanche breakdown voltage that generates carriers and then turns on (or triggers) the BJT formed in region 416, and similarly, the distance 480 between the opposite lateral boundary of the N-type well region 414 and the adjacent lateral boundary of P-well region 444 dictates the collector-to-base avalanche breakdown voltage required to generate carriers and turn on (or -trigger) BJT formed in region 418.

To fabricate P-well regions 442, 444, the protection device structure 400 is masked with a masking material 443 that is patterned to provide an implantation mask that exposes interior portions of the P-type regions 416, 418 while masking the N-type region 414 and deep trench isolation regions 422, 423. In the illustrated embodiment of FIG. 9, the lateral edges of the implantation mask 443 are offset from lateral boundaries of the shallow isolation regions 424, 428, 430, 434 to expose portions of those isolation regions 424, 428, 430, 434 so that the subsequently formed P-well regions 442, 444 extend laterally beneath the shallow isolation regions 424, 428, 430, 434. The P-well regions 442, 444 are then formed by implanting P-type ions, such as boron ions, illustrated by arrows 445, in the exposed portions of the P-type regions 416, 418 with a dopant concentration that is greater than the dopant concentration of the P-type epitaxial layer 412, preferably within the range of $1\times10^{16}/cm^3$ to about $1\times10^{19}/cm^3$, and more preferably around $5\times10^{17}/cm^3$, and at an energy level in the range of about 100 keV to about 1500 keV to provide the P-well regions 442, 444 with a depth (after subsequent thermal annealing or any other diffusion) that is greater than a depth of the shallow isolation regions 424, 426, 428, 430, 432, 434. In exemplary embodiments, the depth of the P-well regions 442, 444 is less than or equal to the thickness of the epitaxial layer 412, so that at least a portion of the lighter doped P-type regions 416, 418 (e.g., at least a portion of the epitaxial layer 412 and/or seed layer 406) remains vertically between the P-well regions 442, 444 and the buried dielectric layer 404. In exemplary embodiments, the depth of the P-well regions 442, 444 is greater than one micron. For example, in one embodiment, the depth of the P-well regions 442, 444 is about 1.75 microns when the depth of the collector well region 414 is about 3.94 microns. In other words, the depth of the collector well region 414 may be more than two times the depth of the P-well regions 442, 444.

Figure 11:
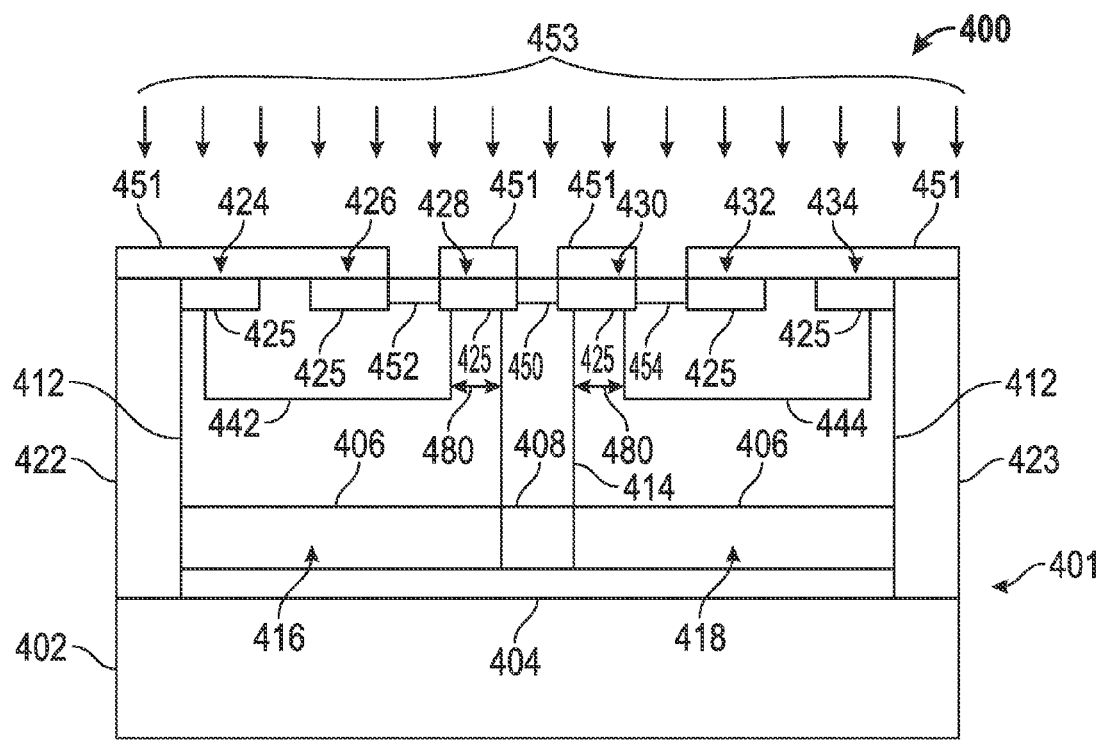
Figure 12:
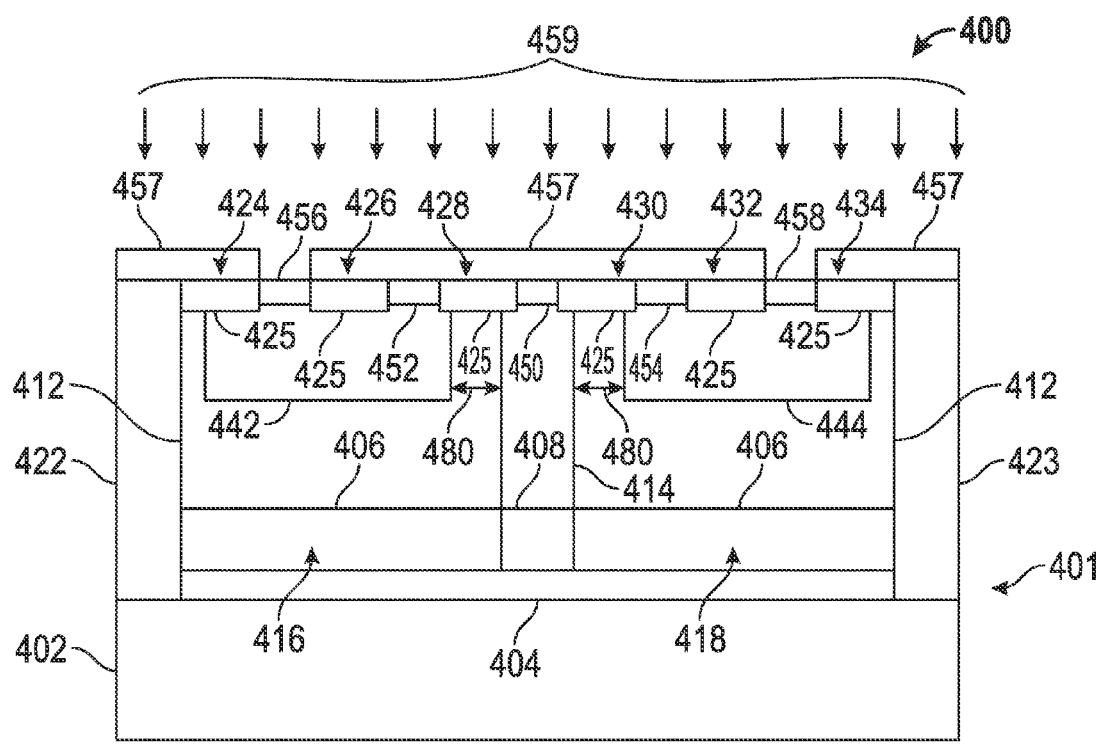

Referring now to FIGS. 11-12, after forming the P-well regions 442, 444, the fabrication process continues by appropriately masking the protection device structure 400, forming shallow N-type contact regions 450, 452, 454 within the N-type region 414 and the P-well regions 442, 444, and forming shallow P-type contact regions 456, 458 within the P-well regions 442, 444. N-type contact region 450 functions as a relatively higher doped collector electrode contact region for the shared collector of the BJTs, each of the N-type contact regions 452, 454 functions as a relatively higher doped emitter electrode for a respective BJT, and each of the P-type regions 456, 458 functions as a relatively higher doped base electrode contact region for a respective BJT. In this regard, the N-type emitter region 452, the P-type base regions 406, 412, 442, 456, and the N-type collector regions 408, 414, 450 function as a first instance of BJT 120 while the second N-type emitter region 454, the P-type base regions 406, 412, 444, 458, and the N-type collector regions 408, 416, 438 function as the second instance of BJT 120.

In exemplary embodiments, the shallow N-type contact regions 450, 452, 454 are formed by masking the protection device structure 400 with a masking material 451 that is patterned to expose the portion of the P-well region 442 between isolation regions 426, 428, the portion of the P-well region 444 between isolation regions 430, 432, and the central portion of the N-type region 414 between isolation regions 428, 430, as illustrated by FIG. 11. The shallow N-type regions 450, 452, 454 are then formed by implanting N-type ions, such as phosphorous ions or arsenic ions, illustrated by arrows 453, in the exposed portions of regions 414, 442, 444 with a dopant concentration in the range of about $1\times10^{19}/cm^3$ to about $1\times10^{21}/cm^3$ and at an energy level in the range of about 20 keV to about 100 keV to provide the N-type regions 450, 452, 454 with a depth (after diffusion) that is less than a depth of the shallow isolation regions 424, 426, 428, 430, 432, 434. For example, in accordance with one or more embodiments, the depth of the shallow N-type regions 450, 452, 454 is in the range of about 0.05 microns to about 0.6 microns. In the illustrated embodiment, each emitter contact region 452, 454 is formed or otherwise resides within a respective higher doped base well region 442, 444 such that the higher doped base well region 442, 444 encompasses, surrounds and/or abuts the respective emitter contact region 452, 454. For example, in one embodiment, the depth of the shallow N-type regions 450, 452, 454 is about 0.56 microns when the depth of the P-well regions 442, 444 is about 1.75 microns and the depth of the collector well region 414 is about 3.94 microns.

Referring to FIG. 12, in a similar manner, the shallow P-type contact regions 456, 458, are formed by masking the protection device structure 400 with a masking material 457 that is patterned to expose the portion of P-well region 442 between isolation regions 424, 426 and the portion of P-well region 444 between isolation regions 432, 434. After the masking material 457 is patterned, the shallow P-type regions 456, 458 are formed by implanting P-type ions, such as boron ions, illustrated by arrows 459, in the exposed portions of the P-well regions 442, 444 with a dopant concentration in the range of about $1\times10^{19}/cm^3$ to about $1\times10^{21}/cm^3$ and at an energy level in the range of about 2 keV to about 50 keV to provide the P-type regions 456, 458 with a depth (after diffusion) that is less than a depth of the shallow isolation regions 424, 426, 428, 430, 432, 434 (e.g., in the range of about 0.05 microns to about 0.6 microns). Each of the base electrode contact regions 456, 458 is encompassed or otherwise surrounded by the respective P-well region 442, 444 it is formed within.

Figure 13:
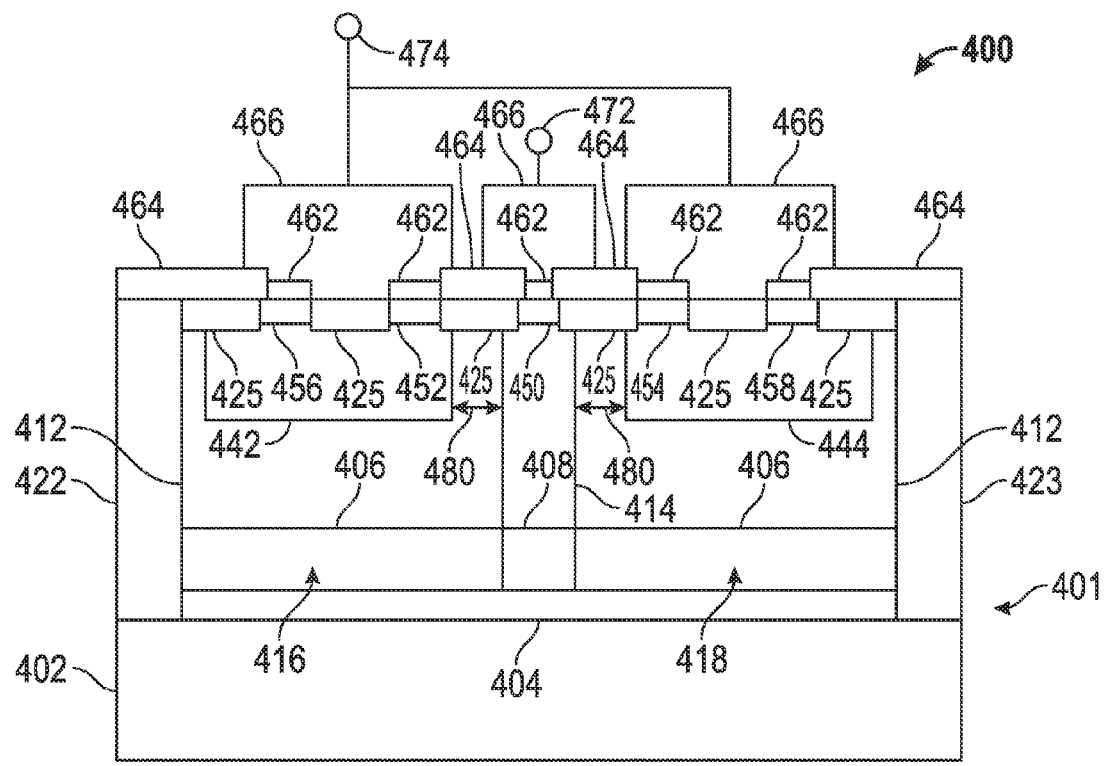

Turning now to FIG. 13, after forming the shallow N-type and P-type regions, fabrication of the protection device structure 400 may be completed by forming conductive contacts 462 on the contact regions 450, 452, 454, 456, 458, providing electrical connections between the respective base and emitter electrodes of the respective BJT elements, and providing electrical connections to/from the electrically connected base and emitter electrodes of the respective BJT elements to a common physical interface 474 of the electronic device that includes the protection device structure 400. An electrical connection is also provided between the shared collector electrode of the BJT elements to another physical interface 472 of the electronic device that includes the protection device structure 400. In this manner, two instances of BJT 120 are provided electrically parallel to one another between package interfaces 102, 104.

The contacts 462 may be realized as a metal silicide layer formed, for example, by conformably depositing a layer of silicide-forming metal onto the exposed surfaces of the contact regions 450, 452, 454, 456, 458 and heating the protection device structure 400, for example, by rapid thermal annealing (RTA), to react the silicide-forming metal with the exposed silicon and form the metal silicide layer 462 at the top of the electrode contact regions 450, 452, 454, 456, 458. After the contacts 462 are formed, the fabrication process continues by forming a layer of dielectric material 464 overlying the protection device structure 400, removing portions of the dielectric material 464 overlying the electrode contact regions 450, 452, 454, 456, 458 to expose the contacts 462, and forming a conductive material 466 overlying the exposed contacts 462. The dielectric material 464 may be realized as an interlayer dielectric material, such as an oxide material, that is conformably deposited overlying the protection device structure 400 in a conventional manner. Portions of the dielectric material 464 overlying the electrode contact regions 450, 452, 454, 456, 458 are removed by etching the dielectric material 464 using an anisotropic etchant to provide voided regions overlying the electrode contacts 462, and the conductive material 466 may be formed in the voided regions by conformably depositing a metal material overlying the protection device structure 400 to a thickness that is greater than or equal to the thickness of the dielectric material 464.

Still referring to FIG. 13, the conductive material 466 is patterned, routed, or otherwise formed to provide a direct electrical connection between the base and emitter electrode of a respective BJT element, thereby effectively short-circuiting the base and emitter of the BJT elements together, in a similar manner as illustrated in FIG. 1. Thus, the emitter and base contact regions 452, 456 of the BJT element formed in region 416 are short-circuited together by the conductive material 466, and similarly, the emitter and base contact regions 454, 458 of the BJT element formed in region 418 are short-circuited together. Additionally, the conductive material 466 short-circuiting the emitter and base contact regions 452, 454, 456, 458 may be patterned, routed, or otherwise formed to provide an electrical connection between the base and emitter electrodes and a lower voltage terminal 474 of an electronic device. In exemplary embodiments, the conductive material 466 overlying the collector regions 408, 414, 450 is patterned, routed, or otherwise formed to provide a direct electrical connection between the common collector electrode of the BJT elements and the higher voltage terminal 472 of the electronic device.

Referring to FIG. 13 and with reference to FIGS. 1-4, by virtue of the collector well regions 408, 414 extending to a depth that is greater than the depth of the emitter regions 452, 454 and the higher doped base well regions 442, 444 without extending laterally or otherwise residing underneath the emitter regions 452, 454, the effective width of the base and/or depletion layer is increased. Thus, the depth of the breakdown region between the collector well regions 408, 414 and the emitter regions 452, 454 relative to the surface of the protection device structure 400 is increased and the voltage difference (or electrical potential) between the package interfaces 472, 474 may be vertically distributed or otherwise supported by a greater percentage of the base well regions 416, 418, 442, 444 residing between the collector well regions 408, 414 and the emitter regions 452, 454, thereby increasing the holding voltage of the protection device structure 400. Additionally, by virtue of the isolation regions 426, 432 residing between the respective emitter regions 452, 454 and the respective base contact regions 456, 458 electrically connected to the emitter regions 452, 454, the voltage difference between the package interfaces 472, 474 may also be laterally distributed or otherwise supported by a greater percentage of the base well regions 416, 418, 442, 444 underlying the isolation regions 426, 432 and/or base contact regions 456, 458, thereby further increasing the holding voltage of the protection device structure 400. By virtue of the collector well regions 408, 414 not extending laterally or otherwise residing underneath the emitter regions 452, 454, the likelihood of punch-through between the collector well regions 408, 414 and the emitter regions 452, 454 is reduced, which, in turn, allows the separation distance between the lateral boundaries of the collector well regions 408, 414 and the neighboring emitter regions 452, 454 to be reduced. Additionally, a greater percentage of a respective lighter doped base well region 416, 418 underlying a respective emitter region 452, 454 is capable of distributing or otherwise supporting the collector voltage, thereby increasing the holding voltage. As described above in the context of FIG. 3, in some embodiments, to further increase the holding voltage, the protection device structure 400 may be fabricated without including the buried collector well region 408 underlying the collector well region 414, such that portions of the lighter doped base well regions 416, 418 extend or otherwise reside underneath the collector well region 414, thereby further increasing the percentage of the lighter doped base well regions 416, 418 that is capable of distributing or otherwise supporting the voltage at the higher voltage terminal 472.

Figure 14:
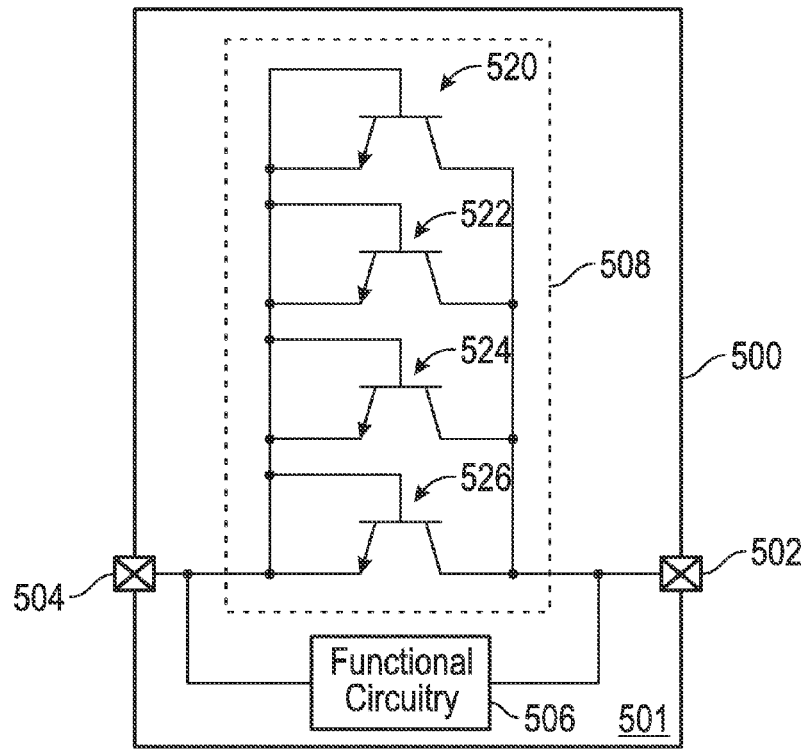
FIG. 14 is a schematic diagram of another exemplary electronic device depicting protection circuitry including a plurality of bipolar junction transistor elements in accordance with one embodiment of the invention.
Figure 15:
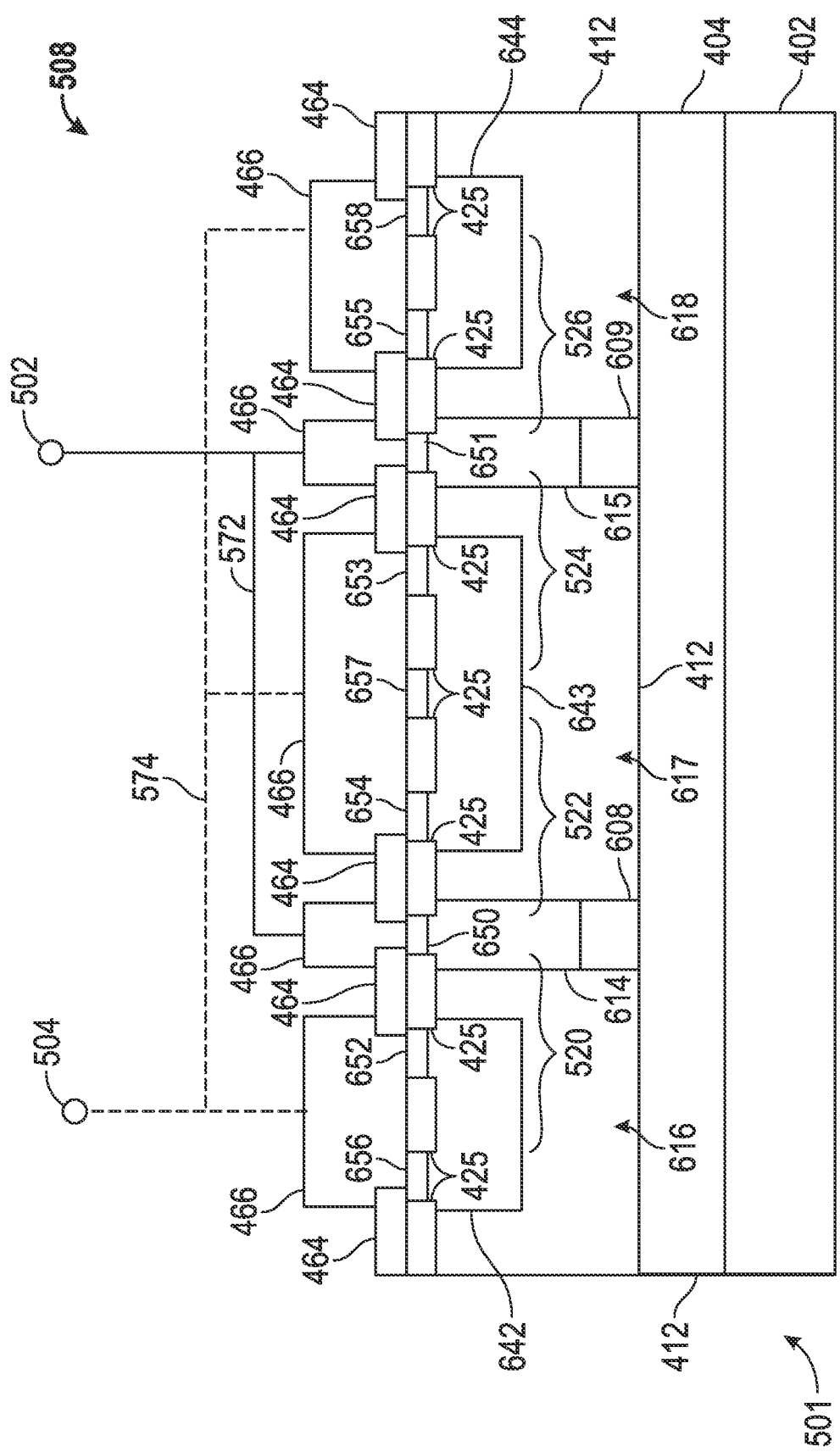
FIG. 15 is a cross-sectional view of the protection circuitry in the electronic device of FIG. 14 in accordance with one embodiment of the invention.
Figure 16:
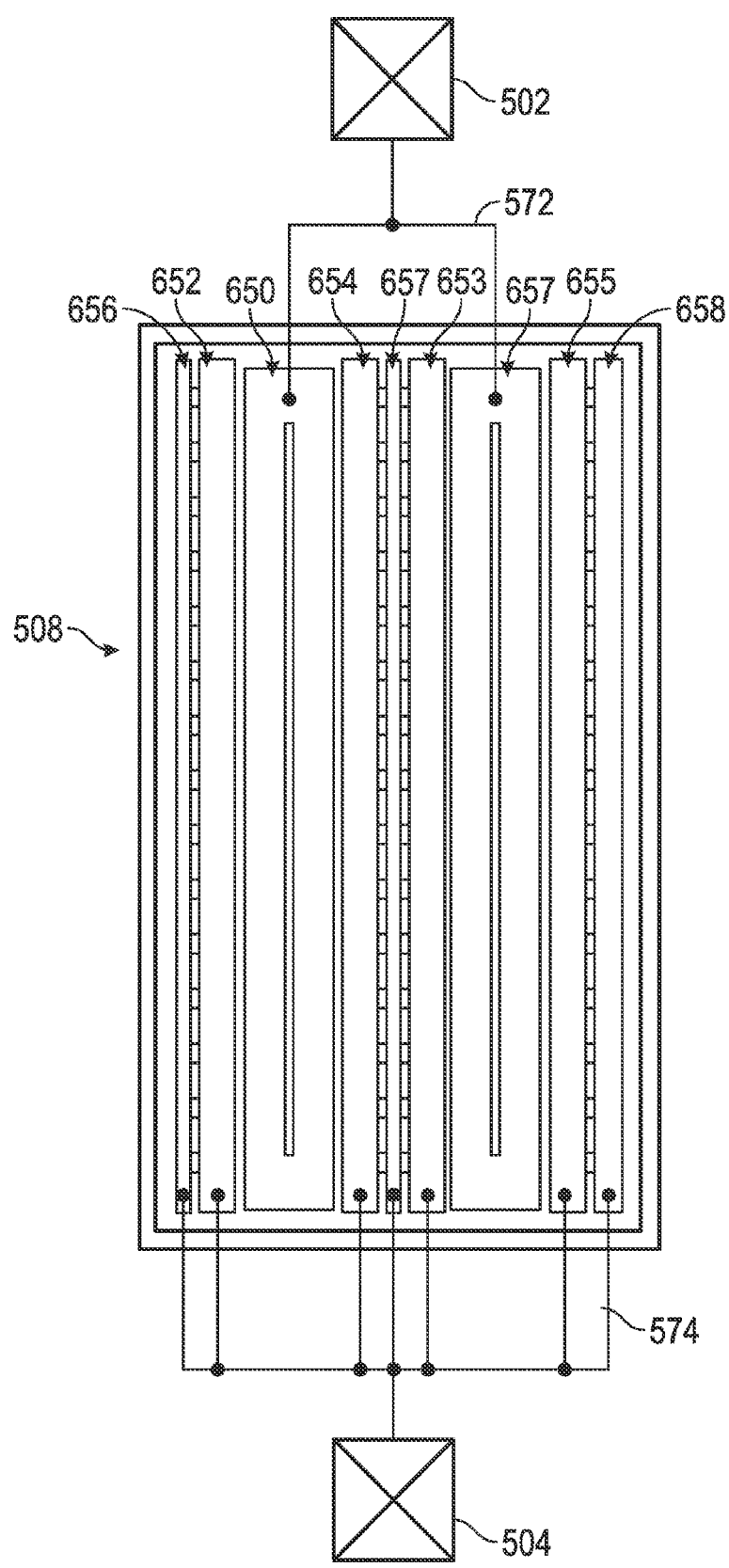
FIG. 16 is a top view of the protection circuitry in the electronic device of FIG. 14 in accordance with one embodiment of the invention.

Referring now to FIGS. 14-16, in accordance with one or more embodiments, the protection circuitry 508 coupled between package interfaces 502, 504 of an electronic device package 500 electrically parallel to the functional circuitry 506 of the device package 500 may include a plurality of BJT elements 520, 522, 524, 526 configured electrically parallel to one another between package interfaces 502, 504. In this regard, adding instances of BJT elements 520, 522, 524, 526 in parallel with one another improves the current handling capability of the protection circuitry 508 (e.g., by increasing the damage onset threshold current). It should be noted that while FIG. 15 depicts a cross-sectional view of the protection circuitry 508 when the BJT elements 520, 522, 524, 526 are realized as the protection device structure 300 of FIG. 4, in other embodiments, the BJT elements 520, 522, 524, 526 may be realized as the protection device structure 200 of FIG. 3. As illustrated by the top view of the protection circuitry 508 in FIG. 16, the longitudinal axes of the respective electrode regions of adjacent BJT elements 520, 522, 524, 526 are substantially parallel to one another. Accordingly, such a configuration of BJT elements 520, 522, 524, 526 electrically parallel to one another may alternatively be referred to as a multi-finger configuration. Although not illustrated, it should be noted that instances of the multi-finger protection circuitry 508 are also capable of being stacked or otherwise configured electrically in series with one another between package interfaces 502, 504 to achieve increased voltage handling capability.

As best illustrated in FIG. 15, the collector of BJT element 520 formed in region 616 is integral with the collector of adjacent BJT element 522 formed in region 617, and similarly, the collector of BJT element 524 formed in region 617 is integral with the collector of adjacent BJT element 526 formed in region 618. Additionally, in the multi-finger configuration, the base of BJT element 522 formed in region 617 is integral with the base of adjacent BJT element 524 formed in region 617. In this regard, collector regions 608, 614, 650 function as a shared collector for BJT elements 520, 522, collector regions 609, 615, 651 function as a shared collector for BJT elements 524, 526, with the base regions 617, 643, 657 between the shared collectors functioning as a shared base for BJT elements 522, 524.

Referring to FIGS. 14-16, in a similar manner as described above, the conductive material 466 is patterned, routed, or otherwise formed to short-circuit or otherwise provide a direct electrical connection between base regions 616, 642, 656 and emitter region 652 of BJT element 520, base regions 617, 643, 657 and emitter region 654 of BJT element 522, base regions 617, 643, 657 and emitter region 653 of BJT element 524, and base regions 618, 644, 658 and emitter regions 655 of BJT element 526. Electrical connections 574 are provided between the electrically connected base and emitter electrodes of the respective BJT elements 520, 522, 524, 526 and lower voltage terminal 504. Additionally, electrical connections 572 are provided between the collector electrodes of the respective BJT elements 520, 522, 524, 526 and higher voltage terminal 502. As described above, when the collector well regions 608, 609, 614, 615 do not extend laterally or otherwise reside underneath a neighboring emitter region 652, 653, 654, 655, the lateral separation distance (or spacing) between the collector and emitter regions of the respective BJT elements 520, 522, 524, 526 may be reduced, thereby reducing the cross-sectional lateral area of the substrate 501 occupied by the multi-finger protection circuitry 508, or alternatively, allowing a given cross-sectional lateral area of the substrate 501 allocated to the multi-finger protection circuitry 508 to accommodate additional BJT elements and achieve a higher damage onset threshold current for that amount of die area.

For the sake of brevity, conventional techniques related to semiconductor and/or integrated circuit fabrication, ESD protection schemes, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, systems, devices, and methods configured in accordance with example embodiments of the invention relate to:

An apparatus for a semiconductor device is provided. The semiconductor device comprises a first region of semiconductor material having a first conductivity type, an emitter region of semiconductor material having a second conductivity type opposite the first conductivity type, and a collector region of semiconductor material having the second conductivity type. At least a portion of the first region resides between the emitter region and the collector region, a depth of the collector region is greater than a depth of the emitter region, and a depth of a second portion of the first region underlying the emitter region is greater than or equal to the depth of the collector region. In one embodiment, the first region and the emitter region are coupled to a first terminal and the collector region is coupled to a second terminal. In another embodiment, a distance between a lateral boundary of the emitter region and a proximal lateral boundary of the collector region is greater than zero. In yet another embodiment, the collector region does not extend laterally underneath the emitter region. In another embodiment, the collector region contacts an underlying layer of dielectric material, wherein the second portion of the first region abuts the underlying layer of dielectric material.

In accordance with one embodiment, the semiconductor device further comprises a base contact region within the first region, the base contact region having the first conductivity type, and an isolation region within the first region, wherein the isolation region resides laterally between the base contact region and the emitter region and the base contact region and the emitter region are electrically connected. In accordance with another embodiment, the semiconductor device further comprises a base contact region within the first region, the base contact region having the first conductivity type, wherein the base contact region and the emitter region are electrically connected. The semiconductor device may further comprise a first package interface, a second package interface, and functional circuitry coupled between the first interface and the second interface, wherein the base contact region and the emitter region are coupled to the first interface and the collector region is coupled to the second interface. In another embodiment, the semiconductor device further comprises a base well region within the first region, the base well region having the first conductivity type and a first dopant concentration greater than a second dopant concentration of the first region, and a base contact region within the base well region, the base contact region having the first conductivity type and a third dopant concentration greater than the first dopant concentration, wherein at least a portion of the base well region resides between the emitter region and the collector region and the depth of the collector region is greater than a depth of the base well region. The semiconductor device may further comprise an isolation region within the base well region, wherein the isolation region resides laterally between the base contact region and the emitter region and the base contact region and the emitter region are electrically connected.

In one or more embodiments, the collector region comprises a well region of semiconductor material having the second conductivity type and a first dopant concentration and a buried region of semiconductor material underlying the well region, the buried region having the second conductivity type and a second dopant concentration greater than or equal to the first dopant concentration. In one embodiment, the buried region does not extend laterally underneath the emitter region. In another embodiment, lateral boundaries of the well region are substantially aligned with lateral boundaries of the buried region.

In accordance with yet another embodiment, the semiconductor device further comprises a second region of semiconductor material having the first conductivity type and a second emitter region of semiconductor material having the second conductivity type, wherein a third portion of the second region resides between the second emitter region and the collector region, the depth of the collector region is greater than a depth of the second emitter region, and a depth of the second region is greater than or equal to the depth of the collector region. In one embodiment, the first region, the emitter region, the second region, and the second emitter region are coupled to a first terminal and the collector region is coupled to a second terminal. In another embodiment, the semiconductor device further comprises a third emitter region of semiconductor material having the second conductivity type and a second collector region of semiconductor material having the second conductivity type, wherein a fourth portion of the second region resides between the third emitter region and the second collector region, a depth of the second collector region is greater than a depth of the third emitter region, and the depth of the second region is greater than or equal to a depth of the second collector region. In accordance with another embodiment, the semiconductor device further comprises a base well region within the first region, the base well region having the emitter region formed therein, the base well region having the first conductivity type and a first dopant concentration greater than a second dopant concentration of the first region by a factor of at least 10, wherein a distance between a lateral boundary of the base well region and a proximal lateral boundary of the collector region is greater than zero and the portion of the first region resides between the collector region and the base well region.

In another exemplary embodiment, an apparatus is provided for a semiconductor device that comprises a first interface, a second interface, a base well region of semiconductor material having a first conductivity type and a first dopant concentration, a base contact region of semiconductor material within the base well region, the base contact region having the first conductivity type and a second dopant concentration greater than the first dopant concentration, an emitter region of semiconductor material within the base well region, the emitter region having a second conductivity type opposite the first conductivity type, and a collector region of semiconductor material having the second conductivity type. At least a portion of the base well region resides between the emitter region and the collector region, a depth of the collector region is greater than a depth of the emitter region, a distance between a lateral boundary of the emitter region and a proximal lateral boundary of the collector region is greater than zero, the base contact region and the emitter region are coupled to the first interface, and the collector region is coupled to the second interface.

A method of fabricating a semiconductor device structure on a semiconductor substrate is provided in another exemplary embodiment. The method comprises forming a first region of semiconductor material having a first conductivity type in the semiconductor substrate, forming a collector region of semiconductor material in the semiconductor substrate, the collector region having a second conductivity type, wherein a depth of the collector region relative to a surface of the semiconductor substrate is less than or equal to a depth of the first region, and forming an emitter region of semiconductor material having the second conductivity type opposite the first conductivity type within the first region, wherein at least a portion of the first region resides between the emitter region and the collector region, the depth of the collector region is greater than a depth of the emitter region, and a distance between a lateral boundary of the emitter region and a proximal lateral boundary of the collector region is greater than zero.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A semiconductor device comprising:
   a first region of semiconductor material having a first conductivity type and a first dopant concentration;
   a base well region within the first region, the base well region having the first conductivity type and a second dopant concentration greater than the first dopant concentration of the first region;
   a base contact region within the base well region, the base contact region having the first conductivity type and a third dopant concentration greater than the first dopant concentration;
   an emitter region of semiconductor material within the base well region, the emitter region having a second conductivity type opposite the first conductivity type; and
   a collector region of semiconductor material having the second conductivity type, wherein:
   at least a portion of the first region resides between the emitter region and the collector region;
   a depth of the collector region is greater than a depth of the emitter region;
   a depth of a second portion of the first region underlying the emitter region is greater than or equal to the depth of the collector region;
   at least a portion of the base well region resides between the emitter region and the collector region; and
   the depth of the collector region is greater than a depth of the base well region.

2. A semiconductor device comprising:
   a first region of semiconductor material having a first conductivity type and a first dopant concentration;
   a base well region within the first region, the base well region having the first conductivity type and a second dopant concentration greater than the first dopant concentration of the first region;
   a base contact region within the base well region, the base contact region having the first conductivity type and a third dopant concentration greater than the first dopant concentration;
   an emitter region of semiconductor material within the base well region, the emitter region having a second conductivity type opposite the first conductivity type; and
   a collector region of semiconductor material having the second conductivity type, wherein:
   at least a portion of the first region resides between the emitter region and the collector region;
   a depth of the collector region is greater than a depth of the emitter region;
   a depth of a second portion of the first region underlying the emitter region is greater than or equal to the depth of the collector region; and
   the collector region comprises:

a well region of semiconductor material having the second conductivity type and a first dopant concentration; and a buried region of semiconductor material underlying the well region, the buried region having the second conductivity type and a second dopant concentration greater than or equal to the first dopant concentration.

3. A semiconductor device comprising:

a first region of semiconductor material having a first conductivity type;

an emitter region of semiconductor material having a second conductivity type opposite the first conductivity type;

a collector region of semiconductor material having the second conductivity type; and a base well region within the first region, the base well region having the emitter region formed therein, the base well region having the first conductivity type and a first dopant concentration greater than a second dopant concentration of the first region by a factor of at least 10, wherein:

at least a portion of the first region resides between the emitter region and the collector region;

a depth of the collector region is greater than a depth of the emitter region;

a depth of a second portion of the first region underlying the emitter region is greater than or equal to the depth of the collector region;

a distance between a lateral boundary of the base well region and a proximal lateral boundary of the collector region is greater than zero; and the portion of the first region resides between the collector region and the base well region.

4. The semiconductor device of claim 1, wherein:

the first region and the emitter region are coupled to a first terminal; and the collector region is coupled to a second terminal.

5. The semiconductor device of claim 1, wherein a distance between a lateral boundary of the emitter region and a proximal lateral boundary of the collector region is greater than zero.

6. The semiconductor device of claim 1, wherein the collector region does not extend laterally underneath the emitter region.

7. The semiconductor device of claim 1, wherein the collector region contacts an underlying layer of dielectric material.

8. The semiconductor device of claim 7, wherein the second portion abuts the underlying layer of dielectric material.

9. The semiconductor device of claim 1, further comprising:

an isolation region within the first region, wherein:

the isolation region resides laterally between the base contact region and the emitter region; and the base contact region and the emitter region are electrically connected.

10. The semiconductor device of claim 1, further comprising:

a first interface;

a second interface; and functional circuitry coupled between the first interface and the second interface, wherein:

the base contact region and the emitter region are coupled to the first interface; and the collector region is coupled to the second interface.

11. The semiconductor device of claim 1, further comprising an isolation region within the base well region, wherein:

the isolation region resides laterally between the base contact region and the emitter region; and the base contact region and the emitter region are electrically connected.

12. The semiconductor device of claim 2, wherein the buried region does not extend laterally underneath the emitter region.

13. The semiconductor device of claim 2, wherein lateral boundaries of the well region are substantially aligned with lateral boundaries of the buried region.

14. The semiconductor device of claim 1, further comprising:

a second region of semiconductor material having the first conductivity type; and a second emitter region of semiconductor material having the second conductivity type, wherein:

a third portion of the second region resides between the second emitter region and the collector region;

the depth of the collector region is greater than a depth of the second emitter region; and a depth of the second region is greater than or equal to the depth of the collector region.

15. The semiconductor device of claim 14, wherein:

the first region, the emitter region, the second region, and the second emitter region are coupled to a first terminal; and the collector region is coupled to a second terminal.

16. The semiconductor device of claim 14, further comprising:

a third emitter region of semiconductor material having the second conductivity type; and a second collector region of semiconductor material having the second conductivity type, wherein:

a fourth portion of the second region resides between the third emitter region and the second collector region;

a depth of the second collector region is greater than a depth of the third emitter region; and the depth of the second region is greater than or equal to a depth of the second collector region.

17. The semiconductor device of claim 2, wherein the base contact region and the emitter region are electrically connected.

18. The semiconductor device of claim 17, further comprising:

a first interface;

a second interface; and functional circuitry coupled between the first interface and the second interface, wherein:

the base contact region and the emitter region are coupled to the first interface; and the collector region is coupled to the second interface.

19. The semiconductor device of claim 2, wherein:

the first region and the emitter region are coupled to a first terminal; and the collector region is coupled to a second terminal.

20. The semiconductor device of claim 2, wherein a distance between a lateral boundary of the emitter region and a proximal lateral boundary of the collector region is greater than zero.

* * * * *